US011245046B2

United States Patent
Dong et al.

(10) Patent No.: US 11,245,046 B2
(45) Date of Patent: Feb. 8, 2022

(54) MULTI-JUNCTION TANDEM LASER PHOTOVOLTAIC CELL AND MANUFACTURING METHOD THEREOF

(71) Applicant: Suzhou Institute of Nano-Tech and Nano-Bionics (Sinano), Chinese Academy of Sciences, Suzhou (CN)

(72) Inventors: Jianrong Dong, Suzhou (CN); Yongming Zhao, Suzhou (CN); Yurun Sun, Suzhou (CN); Jie Huang, Suzhou (CN); Shuzhen Yu, Suzhou (CN)

(73) Assignee: Suzhou Institute of Nano-Tech and Nano-Bionics, Chinese Academy of Sciences, Suzhou (CN)

( * ) Notice: Subject to any disclaimer, the term of this patent is extended or adjusted under 35 U.S.C. 154(b) by 0 days.

(21) Appl. No.: 16/500,045

(22) PCT Filed: Oct. 16, 2017

(86) PCT No.: PCT/CN2017/106334
§ 371 (c)(1),
(2) Date: Oct. 1, 2019

(87) PCT Pub. No.: WO2018/192199
PCT Pub. Date: Oct. 25, 2018

(65) Prior Publication Data
US 2020/0185558 A1    Jun. 11, 2020

(30) Foreign Application Priority Data
Apr. 17, 2017    (CN) .......................... 201710249314.9

(51) Int. Cl.
*H01L 31/0224*    (2006.01)
*H01L 31/0725*    (2012.01)
(Continued)

(52) U.S. Cl.
CPC .. *H01L 31/0687* (2013.01); *H01L 31/022425* (2013.01); *H01L 31/03046* (2013.01); *H01L 31/0693* (2013.01); *H01L 31/1844* (2013.01)

(58) Field of Classification Search
CPC ......... H01L 31/0687; H01L 31/022425; H01L 31/03046; H01L 31/0693; H01L 31/1844
See application file for complete search history.

(56) References Cited

U.S. PATENT DOCUMENTS 4,427,841 A * 1/1984 Rahilly ............... H01L 31/0693
                                                       136/255
2005/0081910 A1 * 4/2005 Danielson ........... H01L 31/0687
                                                       136/255

FOREIGN PATENT DOCUMENTS

CN    102651416    *  8/2012
CN    102651420    *  8/2012

* cited by examiner

*Primary Examiner* — Jayne L Mershon
(74) *Attorney, Agent, or Firm* — Wang Law Firm, Inc.

(57) ABSTRACT

The present application discloses a multi-junction tandem laser photovoltaic cell, comprising a photovoltaic cell stack and a bottom electrode and a top electrode electrically connected to a bottom and a top of the photovoltaic cell stack, respectively, wherein the photovoltaic cell stack comprises stacked N AlGaAs PN-junction sub-cells, and adjacent sub-cells are connected in series via a tunneling junction, in which N≥2. The AlGaAs PN-junction sub-cells use an AlGaAs absorbing layer. The present application further discloses a method of making the multi-junction tandem laser photovoltaic cell. The present application uses AlGaAs as the absorbing layer of the multi-junction tandem cell to convert laser energy, which can effectively increase the open circuit voltage of the photovoltaic cell, thereby significantly improving the conversion efficiency of the photovoltaic cell.

14 Claims, 2 Drawing Sheets

(51) Int. Cl.
*H01L 31/18* (2006.01)
*H01L 31/0693* (2012.01)
*H01L 31/0735* (2012.01)
*H01L 31/0687* (2012.01)
*H01L 31/0304* (2006.01)

MULTI-JUNCTION TANDEM LASER PHOTOVOLTAIC CELL AND MANUFACTURING METHOD THEREOF

TECHNICAL FIELD

The present application relates to a multi-junction photovoltaic cell, and in particular to a multi-junction tandem laser photovoltaic cell using AlGaAs as an absorbing layer and a manufacturing method thereof.

BACKGROUND

The laser energy supply system is a new energy transfer system, with which light emitted from a laser source is delivered through an optical fiber to a laser photovoltaic cell to provide a stable power output. The conversion of fiber-guided light into electricity has more advantages than the traditional metal wire and coaxial cable power transmission technology, which can be applied in the case where it is needed to eliminate electromagnetic interference or to isolate electronic devices from the surrounding environment. There are important applications in radio communication, industry sensors, defense, aviation, medicine, energy and other fields. The operating principle of a laser photovoltaic cell is similar to that of a solar cell, but the laser photovoltaic cell can achieve higher conversion efficiencies due to being for monochromatic sources. Unlike a conventional solar cell, the light source is a laser with the wavelength of 790 nm-850 nm suitable for optical fiber transmission.

GaAs is III-V compound semiconductor material, and its band gap $E_g$ at room temperature is 1.428 eV. A GaAs PN-junction cell can be used to convert laser energy of 790-850 nm into electrical energy for use as a photoelectric converting element in the laser energy supply system. The open circuit voltage of GaAs photovoltaic cells is about 1V. GaAs multi-junction tandem laser photovoltaic cells are grown on GaAs or Ge conductive substrates, and the sub-cells are connected by tunneling junctions, so that a higher output voltage can be obtained. However, for the more mature and widely used laser of 808 nm (photon energy of 1.5346 eV), since the photon energy is larger than the forbidden band gap of GaAs by 0.1066 eV, when GaAs is used as the absorbing layer to absorb the laser of 808 nm, the electrons excited from a valence band to a conduction band by each photon will lose energy of 0.1066 eV through thermal relaxation, accounting for 6.9% of the photon energy and accounting for more than 10% of the output electrical energy.

SUMMARY

The main object of the present application is to provide a multi-junction tandem laser photovoltaic cell and a manufacturing method thereof to overcome the deficiencies in the prior art.

To achieve the above object, the technical solution adopted by the present application is as follows.

The embodiment of the present application provides a multi-junction tandem laser photovoltaic cell, comprising a photovoltaic cell stack and a bottom electrode and a top electrode electrically connected to a bottom and a top of the photovoltaic cell stack, respectively, wherein the photovoltaic cell stack comprises stacked N AlGaAs PN-junction sub-cells, and two adjacent sub-cells are connected in series via a tunneling junction, in which N≥2.

Further, a light absorbing layer in the AlGaAs PN-junction sub-cells comprises a P-type $Al_{x1}Ga_{1-x1}As$ base region and an N-type $Al_{x1}Ga_{1-x1}As$ emitter region, wherein the x1 has such a value that the incident laser has a wavelength less than or equal to the absorption long wavelength limit of $Al_{x1}Ga_{1-x1}As$.

Further, the bottom of the photovoltaic cell stack is electrically connected to the bottom electrode via a conductive substrate.

Still further, the photovoltaic cell stack is further sequentially provided with a current spreading layer and an ohmic contact layer, the ohmic contact layer is electrically connected to the top electrode, and the current spreading layer does not absorb incident light.

Still further, if the conductive substrate is an N-type substrate, the photovoltaic cell stack comprises a first tunneling junction, a first AlGaAs sub-cell to an Nth tunneling junction, and an Nth AlGaAs sub-cell sequentially formed on the conductive substrate, wherein the tunneling junctions and the sub-cell are alternately arranged, and none of the first tunneling junction to the Nth tunneling junction absorbs the incident light.

Still further, if the conductive substrate is a P-type substrate, the photovoltaic cell stack comprises a first AlGaAs sub-cell, a first tunneling junction to an (N−1)th AlGaAs sub-cell, an (N−1)th tunneling junction, and an Nth AlGaAs sub-cell sequentially formed on the conductive substrate, wherein the tunneling junctions and the sub-cells are alternately arranged, and none of the first tunneling junction to the (N−1)th tunneling junction absorbs the incident light.

The embodiment of the present application further provides a method for manufacturing the multi-junction tandem laser photovoltaic cell, comprising:

forming the photovoltaic cell stack on the front surface of the conductive substrate;

forming a dielectric film on the photovoltaic cell stack, and etching opening on the dielectric film to expose at least a partial region of the ohmic contact layer of the photovoltaic cell stack;

manufacturing a top electrode on the ohmic contact layer exposed by the opening;

etching the region, which is not covered by the top electrode, of the ohmic contact layer until the current spreading layer of the photovoltaic cell stack is exposed; and manufacturing a bottom electrode on the back surface of the conductive substrate.

Compared with the prior art, the present application uses AlGaAs as the absorbing layer of the multi-junction tandem cell to convert laser energy, which can effectively increase the open circuit voltage of the photovoltaic cell, thereby significantly improving the conversion efficiency of the photovoltaic cell.

DESCRIPTION OF THE EMBODIMENTS

Figure 1:
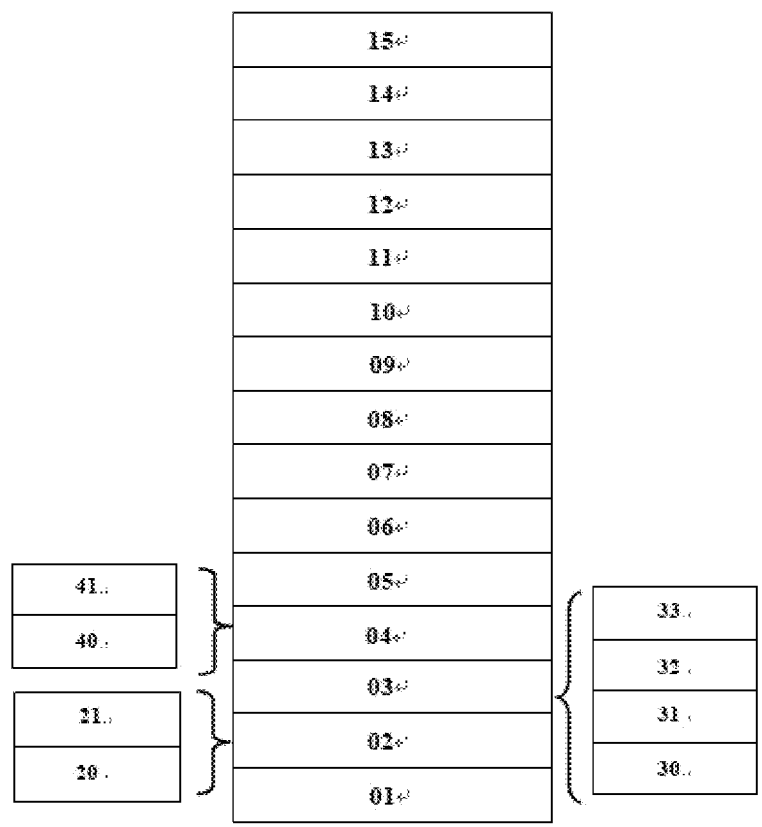
FIG. 1 is a schematic cross-section illustrating an epitaxial wafer of an AlGaAs six-junction tandem laser photovoltaic cell according to an exemplary embodiment of the present application.

In view of the deficiencies in the prior art, the inventors of the present application have proposed the technical scheme of the present application, which will be described in detail below.

An aspect of an embodiment of the present application first provides a multi-junction tandem laser photovoltaic cell, comprising a photovoltaic cell stack and a bottom electrode and a top electrode electrically connected to a bottom and a top of the photovoltaic cell stack, respectively, wherein the photovoltaic cell stack comprises stacked N AlGaAs PN-junction sub-cells, and adjacent sub-cells are connected in series via a tunneling junction, in which N≥2.

Further, a light absorbing layer in the AlGaAs PN-junction sub-cells comprises a P-type $Al_{x1}Ga_{1-x1}As$ base region and an N-type $Al_{x1}Ga_{1-x1}As$ emitter region, wherein the x1 has such a value that the incident light has a wavelength less than or equal to the absorption long wavelength limit of $Al_{x1}Ga_{1-x1}As$, especially close to and less than the absorption long wavelength limit of $Al_{x1}Ga_{1-x1}As$. More specifically, the design of x1 in $Al_{x1}Ga_{1-x1}As$ varies with the wavelength of the incident laser, that is, the specific composition of $Al_{x1}Ga_{1-x1}As$ may be adjusted according to the wavelength of the incident laser to satisfy the above requirements. For example, when the wavelength of the incident laser is in the range of 830 to 650 nm, the x1 may be 0.02 to 0.38.

Still further, the AlGaAs sub-cell comprises a P-type back field layer, a P-type $Al_{x1}Ga_{1-x1}As$ base region, an N-type $Al_{x1}Ga_{1-x1}As$ emitter region, and an N-type window layer sequentially arranged in a set direction, wherein neither the P-type back field layer nor the N-type window layer absorbs incident laser.

In some embodiments, the multi-junction tandem laser photovoltaic cell comprises a conductive monocrystalline substrate, a plurality of AlGaAs sub-cells, tunnel junctions between sub-cells, a current spreading layer, and an ohmic contact layer. Sub-cells are connected in series by a tunneling junction.

Still further, the bottom of the photovoltaic cell stack is electrically connected to the bottom electrode via a conductive substrate.

Preferably, the conductive substrate is selected from a conductive monocrystalline substrate.

Preferably, the material of the conductive monocrystalline substrate includes, but is not limited to, GaAs or Ge.

Still further, the photovoltaic cell stack is formed on the conductive substrate, and the AlGaAs sub-cell comprises a P-type $Al_{x2}Ga_{1-x2}As$ or P-type $Ga_{0.52}In_{0.48}P$ back field layer, a P-type $Al_{x1}Ga_{1-x1}As$ base region, an N-type $Al_{x1}Ga_{1-x1}As$ emitter region, an N-type $Al_{x3}Ga_{1-x3}As$ or N-type $Ga_{0.52}In_{0.48}P$ window layer sequentially arranged in a direction away from the conductive substrate, where the x2 and the x3 has such a value that $Al_{x2}Ga_{1-x2}As$ and $Al_{x3}Ga_{1-x3}As$ do not absorb incident light. In other words, the x2 and the x3 may be adjusted according to the wavelength of the incident laser, thereby changing the specific compositions of $Al_{x2}Ga_{1-x2}As$ and $Al_{x3}Ga_{1-x3}As$ to satisfy the above requirements.

Still further, the photovoltaic cell stack is further sequentially provided with a current spreading layer and an ohmic contact layer, the ohmic contact layer is electrically connected to the top electrode, and the current spreading layer does not absorb incident light.

Preferably, the material of the ohmic contact layer includes, but is not limited to, GaAs.

In some embodiments, the conductive substrate is an N-type conductivity, and the photovoltaic cell stack comprises a first tunneling junction, a first AlGaAs sub-cell to an Nth tunneling junction, and an Nth AlGaAs sub-cell sequentially formed on the conductive substrate, wherein the tunneling junctions and the sub-cell are alternately arranged, and none of the first tunneling junction to the Nth tunneling junction absorbs the incident light.

Further, the first tunneling junction comprises an (N+)-type $Ga_{0.52}In_{0.48}P$ or (N+)-type (Al)GaAs layer and a (P+)-type (Al) GaAs layer arranged in a direction away from the conductive substrate, and any of the second tunneling junction to the Nth tunneling junction comprises an (N+)-type $Ga_{0.51}In_{0.49}P$ or (N+)-type $Al_{x4}Ga_{1-x4}As$ (x4>x1) layer and a (P+)-type $Al_{x5}Ga_{1-x5}As$ (x5>x1) layer arranged in a direction away from the conductive substrate, where the x4 and the x5 have such values that $Al_{x4}Ga_{1-x4}As$ and $Al_{x5}Ga_{1-x5}As$ do not absorb the incident light. In other words, the x4 and the x5 may be adjusted according to the wavelength of the incident light, thereby changing the specific composition of $Al_{x4}Ga_{1-x4}As$ and $Al_{x5}Ga_{1-x5}As$ to satisfy the above requirements.

Still further, the compositions of the second tunneling junction to the Nth tunneling junction may be identical.

Still further, the Nth AlGaAs sub-cell is further formed with an N-type $Ga_{0.51}In_{0.49}P$ or an N-type $Al_{x6}Ga_{1-x6}As$ current spreading layer and an (N+)-type GaAs ohmic contact layer, where the x6 has such a value that the current spreading layer does not absorb the incident light. In other words, the x6 may be adjusted according to the wavelength of the incident light, thereby changing the specific composition of $Al_{x6}Ga_{1-x6}As$ to satisfy the above requirements.

In some embodiments, the conductive substrate is a P-type substrate, and the photovoltaic cell stack comprises a first AlGaAs sub-cell, a first tunneling junction to an (N−1)th AlGaAs sub-cell, an (N−1)th tunneling junction, and an Nth AlGaAs sub-cell sequentially formed on the conductive substrate, wherein the tunneling junctions and the sub-cells are alternately arranged, and none of the first tunneling junction to the (N−1)th tunneling junction absorbs the incident light.

Further, any one of the first tunneling junction to the (N−1)th tunneling junction comprises an (N+)-type $Ga_{0.52}In_{0.48}P$ or (N+)-type $Al_{x4}Ga_{1-x4}As$ layer and a (P+)-type $Al_{x5}Ga_{1-x5}As$ layer sequentially arranged in a direction away from the conductive substrate, where x4>x1, x5>x1, and the x4 and the x5 have such values that $Al_{x4}Ga_{1-x4}As$ and $Al_{x5}Ga_{1-x5}As$ do not absorb the incident light. That is, the x4 and the x5 may be adjusted according to the wavelength of the incident light, thereby changing the specific composition of $Al_{x4}Ga_{1-x4}As$ and $Al_{x5}Ga_{1-x5}As$ to satisfy the above requirements.

Still further, the compositions of matter of the first tunneling junction to the (N−1)th tunneling junction may be identical.

Still further, the Nth AlGaAs sub-cell is further formed with an N-type $Ga_{0.52}In_{0.48}P$ or N-type $Al_{x6}Ga_{1-x6}As$ current spreading layer and an (N+)-type GaAs ohmic contact layer, where x6>x1, and the x6 has such a value that the current spreading layer does not absorb the incident light. That is, the x6 may be adjusted according to the wavelength of the incident light, thereby changing the specific composition of $Al_{x6}Ga_{1-x6}As$ to satisfy the above requirements.

Still further, the thicknesses of AlGaAs PN-junction sub-cells in the photovoltaic cell stack are set such that each AlGaAs PN-junction sub-cell produces the same photocurrent when sufficiently absorbing the incident laser energy.

Still further, the thickness of the absorbing layer of each AlGaAs sub-cell should ensure sufficient absorption of the incident laser energy and the same photocurrent generated in each AlGaAs sub-cell.

Still further, the light-receiving surface of the multi-junction tandem laser photovoltaic cell is further provided with an anti-reflection film.

For example, the light-receiving surface is distributed on the top surface of the multi-junction tandem laser photovoltaic cell.

The multi-junction tandem laser photovoltaic cell described in the present application can utilize the energy of the incident photon to the utmost extent by adopting a multi-junction AlGaAs tandem structure in which a band gap of the absorbing layer $Al_{x1}Ga_{1-x1}As$ is equal to or slightly smaller than the wavelength of the incident light, thereby obtaining the maximum output voltage. For example, in the case of the incident laser of 808 nm, the efficiency of the multi-junction tandem laser photovoltaic cell of the present application can be at least about 8% higher (relative lifting ratio) than a cell of similar structure using GaAs as the absorbing layer.

Another aspect of the embodiment of the present application further provides a method for manufacturing the multi-junction tandem laser photovoltaic cell, comprising:

forming the photovoltaic cell stack on the front surface of a conductive substrate;

forming a dielectric film on the photovoltaic cell stack, and opening windows on the dielectric film to expose at least a partial region of the ohmic contact layer of the photovoltaic cell stack;

manufacturing a top electrode on the ohmic contact layer exposed by the windows;

etching the region, which is not covered by the top electrode, of the ohmic contact layer until the current spreading layer of the photovoltaic cell stack is exposed; and manufacturing a bottom electrode on the back surface of the conductive substrate.

In some embodiments, the manufacturing method comprises: sequentially growing and forming a plurality of AlGaAs PN-junction sub-cells, tunneling junctions via which the sub-cells are electrically connected, a current spreading layer, and a top heavily-doped ohmic contact layer on the conductive monocrystalline substrate, and then manufacturing a top grid electrode, a bottom electrode, and an anti-reflection film comprising a grid electrode, respectively, to form a target device. The absorbing layer of each of the sub-cells is AlGaAs.

Further, the manufacturing method may comprise: growing and forming the photovoltaic cell stack using at least one method of metaorganic chemical vapor deposition (MOCVD) and molecular beam epitaxy (MBE).

Preferably, in the process of growing and forming the photovoltaic cell stack, the N-type dopant atoms comprise Si, Se, S or Te.

Preferably, in the process of growing and forming the photovoltaic cell stack, the P-type dopant atoms comprise Be, Zn, Mg or C.

Further, the manufacturing method may further comprise: first thinning the conductive substrate from back side, and then manufacturing a bottom electrode on the back surface of the conductive substrate.

Further, the manufacturing method may further comprise: forming an ohmic contact between the top electrode and the ohmic contact layer using at least a rapid annealing method.

Further, the manufacturing method may further comprise: manufacturing an anti-reflection film on the light-receiving surface of the formed multi-junction tandem laser photovoltaic cell.

In some more specific embodiments of the present application, the manufacturing method may comprise the steps of:

(1) sequentially growing each layer of material on the conductive monocrystalline substrate using the MOCVD method, wherein the N-type dopant atoms are Si, Se, S or Te; the P-type dopant atoms are Zn, Mg or C;

alternatively, sequentially growing each layer of material on the conductive monocrystalline substrate using the MBE method, wherein the N-type dopant atoms are Si, Se, S or Te; the P-type dopant atoms are Be, Mg or C;

(2) depositing a dielectric film on the front surface (N+ GaAs contact layer) of the epitaxially grown multi-junction tandem cell wafer (photovoltaic cell stack), and then manufacturing a circular window on the dielectric film in a manner of photolithography and etching to expose the N+ GaAs contact layer;

(3) preparing a top electrode comprising a grid electrode in a circular light-receiving region by a step of homogenization, photolithography, electron beam evaporation (or thermal evaporation or magnetron sputtering) of one or more layers of metals and metal lift-off;

(4) removing the portion of the (N+)-type GaAs contact layer not covered by the grid electrode in the circular light-receiving region by a wet etching until the current spreading layer is exposed;

(5) thinning the substrate by mechanical polishing;

(6) manufacturing a planar electrode on the back surface of the substrate by electron beam evaporation, thermal evaporation or magnetron sputtering of one or more layers of metals;

(7) forming an ohmic contact between the metal and the semiconductor using a rapid annealing method;

(8) manufacturing an anti-reflection film on the light-receiving surface;

(9) removing the anti-reflection film at the wire bonding pad beyond the circular light-receiving surface in a manner of photolithography, and exposing the metal for wire bonding;

(10) cleaving or dicing the photovoltaic wafer and separating the laser photovoltaic cell chips to complete the laser photovoltaic cell process.

In some more specific embodiments of the present application, an AlGaAs six-junction tandem laser photovoltaic cell manufactured on an N-type GaAs substrate is described. The manufacturing method of the laser photovoltaic cell comprises the following specific steps.

(I) Growth of an Epitaxial Wafer of a Six-Junction AlGaAs Tandem Laser Photovoltaic Cell (Photovoltaic Cell Stack)

(1) a first tunneling junction is grown on an N-type GaAs substrate, the tunneling junction comprises an (N+)-type $Ga_{0.52}In_{0.48}P$ or (N+)-type (Al)GaAs layer and a (P+)-type (Al)GaAs layer arranged in a direction away from the conductive substrate;

(2) a P-type $Al_{x2}Ga_{1-x2}As$ (x2>x1) or P-type $Ga_{0.52}In_{0.48}P$ back field layer, a P-type $Al_{x1}Ga_{1-x1}As$ base region, an N-type $Al_{x1}Ga_{1-x1}As$ emitter region, an N-type $Al_{x3}Ga_{1-x3}As$ (x3>x1) or N-type $Ga_{0.52}In_{0.48}P$ (lattice-matched to GaAs) window layer are grown on the second tunneling junction to form a first AlGaAs sub-cell;

(3) a second tunneling junction is grown on the first AlGaAs sub-cell, the tunneling junction comprising an (N+)-type $Ga_{0.52}In_{0.48}P$ or (N+)-type $Al_{x4}Ga_{1-x4}As$ (x4>x1) layer and a (P+)-type $Al_{x5}Ga_{1-x5}As$ (x5>x1) layer arranged in a direction away from the conductive substrate, where the x4 and the x5 have such values that $Al_{x4}Ga_{1-x4}As$ and $Al_{x5}Ga_{1-x5}As$ do not absorb the incident light;

(4) a tunneling junction (the structure of which is the same as that of the first tunneling junction) and an AlGaAs sub-cell to the sixth AlGaAs sub-cell are then sequentially grown;

(5) an (N+)-type (greater than $4\times10^{18}$ cm$^{-3}$) GaAs contact layer is grown on the N-type $Al_{x6}Ga_{1-x6}As$ (x6>x1) or $Ga_{0.52}In_{0.48}P$ window layer of the sixth AlGaAs sub-cell for use as an ohmic contact layer, where the x6 is set such that the wide current spreading layer does not absorb the incident light.

Each structural layer in the epitaxial wafer of the six-junction GaAs laser photovoltaic cell is grown using the MOCVD or MBE method.

When MOCVD is used, the N-type dopant atoms are Si, Se, S or Te, and the P-type dopant atoms are Zn, Mg or C.

When MBE used, the N-type dopant atoms are Si, Se, S, Sn, or Te, and the P-type dopant atoms are Be, Mg, or C.

(II) Manufacturing of Devices (Multi-Junction Tandem Laser Photovoltaic Cells)

(1) a dielectric film of $SiO_2$ is deposited on the front surface (N+ GaAs contact layer) of the epitaxially grown AlGaAs six-junction tandem cell wafer using the PECVD, and then a circular window is opened on the $SiO_2$ in a manner of photolithography and etching to expose the N+ GaAs contact layer;

(2) a top electrode comprising a grid electrode in a circular light-receiving region is prepared by a step of homogenization, photolithography, electron beam evaporation (or thermal evaporation or magnetron sputtering) of AuGe/Ni/Au and metal lift-off;

(3) portion of the (N+)-type GaAs contact layer not covered by grid electrode in the circular light-receiving region is etched by a chemical solution until the current spreading layer is exposed;

(4) the wafer is thinned to about 100 μm by mechanical polishing;

(5) a planar electrode is manufactured on the back surface of the substrate by electron beam evaporation, or thermal evaporation or magnetron sputtering of one or more layers of metals (AuGe/Ni/Au are used for N-type GaAs substrate, Ti/Pd/Au are used for P-type GaAs substrate);

(6) an ohmic contact is formed between the metals and the semiconductors using a rapid thermal annealing method;

(7) an anti-reflection film is manufactured on the light-receiving surface;

(8) the anti-reflection film is removed at the wire bonding pads beyond the circular light-receiving surface by wire bonding, and the metal is exposed for wire bonding;

(9) the laser photovoltaic cell wafer is cleaved or diced and separated to complete the laser photovoltaic cell processing.

In the multi-junction laser photovoltaic cell of the present application, $Al_{x1}Ga_{1-x1}As$ is used as an absorbing layer to convert the laser energy, and the Al component of AlGaAs is adjusted so that the wavelength of the incident light is less than or equal to the absorption long wavelength limit of AlGaAs, so that the thermal relaxation loss in the photon energy conversion process is minimized. In the case that the incident light is a laser with a wavelength of about 808 nm, the open circuit voltage of the $Al_{0.07}Ga_{0.93}As$ laser photovoltaic cell can be increased by about 8% compared with the GaAs laser photovoltaic cell, thereby significantly improving the conversion efficiency of the laser photovoltaic cell.

The technical solutions of the present application are explained in more detail below with reference to the accompanying drawings and embodiments.

Figures 2, 3:
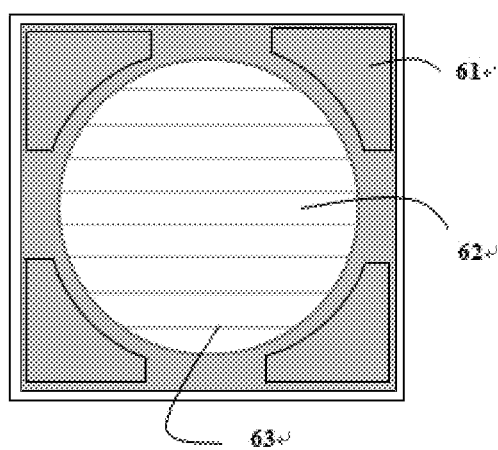
FIG. 2 is a schematic cross-section illustrating an initial product of an AlGaAs six-junction tandem laser photovoltaic cell according to an exemplary embodiment of the present application.
FIG. 3 is a top view illustrating a finished product of an AlGaAs six-junction tandem laser photovoltaic cell according to an exemplary embodiment of the present application.

Referring to FIG. 1, FIG. 2 and FIG. 3, a six-junction AlGaAs tandem laser photovoltaic cell for converting a light of 808 nm is described in an exemplary embodiment of the present application, which may comprise a GaAs substrate 01, a first tunneling junction 02, a first AlGaAs sub-cell 03, a second tunneling junction 04, a second AlGaAs sub-cell 05, a third tunneling junction 06, a third AlGaAs sub-cell 07, a fourth tunneling junction 08, a fourth AlGaAs sub-cell 09, a fifth tunneling junction 10, a fifth AlGaAs sub-cell 11, a sixth tunneling junction 12, a sixth AlGaAs sub-cell 13, a current spreading layer 14, a GaAs ohmic contact layer 15, a cathode electrode 50, a anode electrode 51, an anti-reflection film 52, a wire bonding pad 61, a light-receiving surface 62, an electrode grid line 63, etc, wherein the first AlGaAs sub-cell to the sixth AlGaAs sub-cell 03, 05, 07, 09, 11 and 13 comprise an AlGaAs or GaInP back field layer 30, an AlGaAs base region 31, an AlGaAs emitter region 32, an AlGaAs or GaInP window layer 33; the first tunneling junction 02 comprises (Al)GaAs or GaInP 20 and (Al)GaAs layers 21; the second tunneling junction to the sixth tunneling junction 04, 06, 08, 10 and 12 comprise (Al)GaAs or GaInP 40 and AlGaAs layer 41.

The manufacturing method of the six-junction AlGaAs tandem laser photovoltaic cell specifically comprises the following steps.

(I) Growth of an Epitaxial Wafer of an AlGaAs Six-Junction Tandem Laser Photovoltaic Cell Using MOCVD Method (1) a first tunneling junction 02 is grown on an N-type GaAs substrate ($1-2\times10^{18}$ cm$^{-3}$, having a thickness of 350 μm) 01, comprising an (N+)-type GaAs layer 20 having a Si-doped concentration of $1\times10^{19}$ cm$^{-3}$ of 20 nm and a (P+)-type $Al_{0.3}Ga_{0.7}As$ layer 21 having a C concentration of $4\times10^{19}$ cm$^{-3}$ of 20 nm;

(2) P-type $Al_{0.2}Ga_{0.8}As$ 30 having a C-doped concentration of $1\times10^{18}$ cm$^{-3}$ of 30 nm is grown as the back field of the first AlGaAs sub-cell 03, and then $Al_{0.07}Ga_{0.93}As$ 31 with a C-doped concentration of $4\times10^{17}$ cm$^{-3}$ of 2090 nm is grown as the base region of the first sub-cell 03, then Si-doped $Al_{0.07}Ga_{0.93}As$ 32 with a Si concentration of about $1\times10^{18}$ cm$^{-3}$ of 200 nm is grown as the emitter region of the first sub-cell 03, and then $Al_{0.2}Ga_{0.8}As$ 33 of Si-doped to $1\times10^{18}$ cm$^{-3}$ of 40 nm is grown as the window layer of the first sub-cell 03;

(3) $Al_{0.15}Ga_{0.85}As$ 40 having a Si doping concentration of $1\times10^{19}$ cm$^{-3}$ of 20 nm is grown as the N+ layer of the second tunneling junction 04, and an $Al_{0.3}Ga_{0.7}As$ layer 41 having a C-doped concentration of $4\times10^{19}$ cm$^{-3}$ of 200 nm is grown as the P+ layer of the second tunneling junction 04;

(4) Other AlGaAs sub-cells (05, 07, 09, 11 and 13) and tunneling junctions (06, 08, 10 and 12) to the sixth AlGaAs sub-cell 13 are alternately grown sequentially using the above method. In order to ensure that the device absorbs 99% of the light incident on the cell and satisfies the same photocurrent generated in each AlGaAs sub-cells, the thicknesses of the sub-cell absorbing layers are shown in Table 1.

TABLE 1

Approximate thickness (nm) of the absorbing layers of the AlGaAs sub-cell

| | $Al_{0.07}Ga_{0.93}As$ sub-cell | | | | | |
|---|---|---|---|---|---|---|
| | first | second | third | fourth | fifth | sixth |
| Thickness of the base region | 2090 | 431 | 266 | 186 | 136 | 104 |
| Thickness of the emitter region | 200 | 100 | 50 | 40 | 40 | 40 |

(5) $Ga_{0.52}In_{0.48}P$ 14 having a Si doping concentration of $1\times10^{18}$ cm$^{-3}$ of 1000 nm and the GaAs ohmic contact layer 15 having a Si doping concentration of $6\times10^{18}$ cm$^{-3}$ of 100 nm are grown on the window layer of the sixth AlGaAs sub-cell 13 to complete the growth of the epitaxial wafer, the structure of which can be seen in FIG. 1.

(II) Processing of the Six-Junction AlGaAs Tandem Laser Photovoltaic Cells (1) a $SiO_2$ of 200 nm is deposited on the front surface (N+ GaAs contact layer 15) of the epitaxially grown AlGaAs tandem cell wafer using the PECVD, then the photoresist is spin-coated on the $SiO_2$, the pattern on the photolithographic mask is transferred onto the photoresist by exposure and development of the photoresist to expose the surface of $SiO_2$; then a circular window with a diameter of 2.2 mm is etched on $SiO_2$ by using HF buffer etching solution with the photoresist as a mask to expose N+ GaAs contact layer;

(2) the photoresist is then spin-coated on the front surface of the wafer, and the top electrode pattern on the photolithographic mask is transferred into the previously prepared circle by exposing and developing of the photoresist to expose a portion of the N+ GaAs contact layer to manufacture a grid electrode;

(3) Metal layers of AuGe/Ni/Au (35/10/100 nm), 1000-nm Ag, and 100-nm Au are sequentially deposited on the front surface of the wafer using the electron beam evaporation as the top electrode 50, the stripping method is used to remove the metal of the unneeded region, and an upper electrode comprising a grid line having a width of 6 μm and a spacing of 250 μm in a circular light-receiving surface having a diameter of 2 mm;

(4) area of the (N+)-type GaAs contact layer not covered by the grid electrode in the circular light-receiving region is etched by a chemical solution until the current spreading layer $Ga_{0.52}In_{0.48}P$ 14 of the sixth AlGaAs sub-cell is exposed;

(5) the GaAs substrate 01 is thinned to about 100 μm by mechanically polishing the backside;

(6) AuGe/Ni/Au (35/10/100 nm) is sequentially deposited using electron beam evaporation on the GaAs substrate 01 on the back surface of the wafer to form a lower electrode layer 51, and at this time, refer to FIG. 2 for the structure of the finished product of the obtained AlGaAs six-junction tandem laser photovoltaic cell device;

(7) an ohmic contact is formed between the metal and the N-type GaAs by annealing the wafer in an N2 atmosphere at 420° C. for 90 seconds using a rapid thermal annealing method;

(8) A 43 nm $TiO_2$/102 nm $SiO_2$ double-layer anti-reflection coating 52 is evaporated on the light-receiving surface using an optical coater;

(9) the anti-reflection film at the wire bonding pads outside the circular light-receiving surface in a manner of photolithography, and the metal layer is exposed for wire bonding;

(10) the laser photovoltaic cell chips are cleaved or diced to complete the laser photovoltaic cell processing, and refer to FIG. 3 for the structure of the finished product of the AlGaAs six-junction tandem laser photovoltaic cell device.

It should be understood that the above is only a preferred embodiment example of this application, and does not impose any limitation on the scope of protection of the present application. Any technical solution formed by equivalent transformation or equivalent replacement should fall within the scope of protection of the present application.

What is claimed is:

1. A multi-junction tandem laser photovoltaic cell capable of processing an incident light having an incident laser energy, comprising
a photovoltaic cell stack and a bottom electrode and a top electrode electrically connected to a bottom and a top of the photovoltaic cell stack, respectively,
wherein the photovoltaic cell stack comprises an N number of adjacently stacked AlGaAs PN-junction sub-cells connected in series, in which N≥2, with each two AlGaAs sub-cells connected via a tunneling junction,
wherein the AlGaAs sub-cell comprises a P-type back surface field layer, a P-type $Al_{x1}Ga_{1-x1}As$ base region, an N-type $Al_{x1}Ga_{1-x1}As$ emitter region, and an N-type window layer sequentially arranged in a set direction, wherein X1>0 and a layer of $Al_{x1}Ga_{1-x1}As$ does not contain a fourth element,
wherein neither the P-type back surface field layer nor the N-type window layer absorbs the incident light, and
wherein the P-type $Al_{x1}Ga_{1-x1}As$ base region and the N-type $Al_{x1}Ga_{1-x1}As$ emitter region forms a light absorbing layer and the x1 has such a value that the incident light has a wavelength less than or equal to the absorption long wavelength limit of $Al_{x1}Ga_{1-x1}As$.

2. The multi-junction tandem laser photovoltaic cell according to claim 1, wherein the bottom of the photovoltaic cell stack is electrically connected to the bottom electrode via a conductive substrate that is selected from a conductive monocrystalline substrate that comprises GaAs or Ge.

3. The multi-junction tandem laser photovoltaic cell according to claim 2, wherein the photovoltaic cell stack is formed on the conductive substrate, and the back surface field layer comprises P-type $Al_{x2}Ga_{1-x2}As$ or P-type $Ga_{0.52}In_{0.48}P$, the base region comprises P-type $Al_{x1}Ga_{1-x1}As$, the emitter region comprises N-type $Al_{x1}Ga_{1-x1}As$, the window layer comprises N-type $Al_{x3}Ga_{1-x3}As$ or N-type $Ga_{0.52}In_{0.48}P$, sequentially arranged in a direction away from the conductive substrate, where the x2 and the x3 has such a value that $Al_{x2}Ga_{1-x2}As$ and $Al_{x3}Ga_{1-x3}As$ do not absorb the incident light.

4. The multi-junction tandem laser photovoltaic cell according to claim 3, wherein the conductive substrate uses a GaAs conductive monocrystalline substrate, and the P-type $Al_{x2}Ga_{1-x2}As$ or P-type $Ga_{0.52}In_{0.48}P$ in the back field layer is lattice matched to GaAs.

5. The multi-junction tandem laser photovoltaic cell according to claim 3, wherein the photovoltaic cell stack is further sequentially provided with a current spreading layer and an ohmic contact layer that comprises GaAs, the ohmic contact layer is electrically connected to the top electrode, the current spreading layer does not absorb the incident light.

6. The multi-junction tandem laser photovoltaic cell according to claim 2, wherein the conductive substrate uses an N-type substrate, and the photovoltaic cell stack comprises a first tunneling junction, a first AlGaAs sub-cell to an Nth tunneling junction, and an Nth AlGaAs sub-cell sequentially formed on the conductive substrate, wherein the tunneling junctions and the sub-cell are alternately arranged, and none of the first tunneling junction to the Nth tunneling junction absorbs the incident light.

7. The multi-junction tandem laser photovoltaic cell according to claim 6, wherein the first tunneling junction comprises an (N+)-type $Ga_{0.52}In_{0.48}P$ or (N+)-type (Al)GaAs layer and a (P+)-type (Al) GaAs layer arranged in a direction away from the conductive substrate, and any of the second tunneling junction to the Nth tunneling junction comprises an (N+)-type $Ga_{0.51}In_{0.49}P$ or (N+)-type $Al_{x4}Ga_{1-x4}As$(x4>x1) layer and a (P+)-type $Al_{x5}Ga_{1-x5}As$ (x5>x1) layer arranged in a direction away from the conductive substrate, where the x4 and the x5 have such values that $Al_{x4}Ga_{1-x4}As$ and $Al_{x5}Ga_{1-x5}As$ do not absorb the incident light.

8. The multi-junction tandem laser photovoltaic cell according to claim 6, wherein the Nth AlGaAs sub-cell is further formed with an N-type $Ga_{0.51}In_{0.49}P$ or an N-type $Al_{x6}Ga_{1-x6}As$ current spreading layer and an (N+)-type GaAs ohmic contact layer, where the x6 has such a value that the current spreading layer does not absorb the incident light.

9. The multi-junction tandem laser photovoltaic cell according to claim 2, wherein the conductive substrate uses a P-type substrate, and the photovoltaic cell stack comprises a first AlGaAs sub-cell, a first tunneling junction to an (N−1)th AlGaAs sub-cell, an (N−1)th tunneling junction, and an Nth AlGaAs sub-cell sequentially formed on the conductive substrate, wherein the tunneling junctions and the sub-cells are alternately arranged, and none of the first tunneling junction to the (N−1)th tunneling junction absorbs the incident light.

10. The multi-junction tandem laser photovoltaic cell according to claim 9, wherein any one of the first tunneling junction to the (N−1)th tunneling junction comprises an (N+)-type $Ga_{0.52}In_{0.48}P$ or (N+)-type $Al_{x4}Ga_{1-x4}As$ layer and a (P+)-type $Al_{x5}Ga_{1-x5}As$ layer sequentially arranged in a direction away from the conductive substrate, where x4>x1, x5>x1, and the x4 and the x5 have such values that $Al_{x4}Ga_{1-x4}As$ and $Al_{x5}Ga_{1-x5}As$ do not absorb the incident light.

11. The multi-junction tandem laser photovoltaic cell according to claim 9, wherein the Nth AlGaAs sub-cell is further formed with an N-type $Ga_{0.52}In_{0.48}P$ or N-type $Al_{x6}Ga_{1-x6}As$ current spreading layer and an (N+)-type GaAs ohmic contact layer, where x6>x1, and the x6 has such a value that the current spreading layer does not absorb the incident light.

12. The multi-junction tandem laser photovoltaic cell according to claim 1, wherein the thickness of each AlGaAs PN-junction sub-cell in the photovoltaic cell stack is such that each AlGaAs PN-junction sub-cell produces the same photocurrent when sufficiently absorbing the incident laser energy.

13. The multi-junction tandem laser photovoltaic cell according to claim 1, wherein the light-receiving surface of the multi-junction tandem laser photovoltaic cell is distributed on the top surface of the multi-junction tandem laser photovoltaic cell and further provided with an anti-reflection film.

14. The multi-junction tandem laser photovoltaic cell according to claim 1, wherein the tunneling junction consists of two layers.

* * * * *